United States Patent [19]

Schade, Jr.

[11] 4,456,837
[45] Jun. 26, 1984

[54] CIRCUITRY FOR GENERATING NON-OVERLAPPING PULSE TRAINS

[75] Inventor: Otto H. Schade, Jr., North Caldwell, N.J.

[73] Assignee: RCA Corporation, New York, N.Y.

[21] Appl. No.: 311,512

[22] Filed: Oct. 15, 1981

[51] Int. Cl.³ .................. H03K 5/00; H03K 5/01; H03K 5/156
[52] U.S. Cl. .................... 307/262; 307/269; 307/288; 307/268
[58] Field of Search ............ 307/279, 262, 265, 268, 307/269, 288, 585, 448, 513, 451, 255

[56] References Cited

U.S. PATENT DOCUMENTS

| T955,006 | 2/1977 | Cavaliere et al. | 307/585 |
|---|---|---|---|
| 3,668,436 | 6/1972 | Bacon | 307/262 |
| 3,939,643 | 2/1976 | Nishikubo | 58/23 |
| 3,961,269 | 6/1976 | Alvarez, Jr. | 328/62 |
| 4,034,242 | 7/1977 | Heeren | 307/269 |
| 4,045,685 | 8/1977 | Gehrig | 307/208 |
| 4,090,096 | 5/1978 | Nagami | 307/265 |
| 4,097,771 | 6/1978 | Gollinger | 307/268 |
| 4,103,188 | 7/1978 | Morton | 307/255 |
| 4,107,549 | 8/1978 | Moufah | 307/469 |
| 4,140,927 | 2/1979 | Feucht | 307/262 |
| 4,211,985 | 7/1980 | Yamashiro | 331/116 |
| 4,295,062 | 10/1987 | Mihalich et al. | 307/279 |
| 403,716,723 | 2/1973 | Heuner et al. | 307/585 |

FOREIGN PATENT DOCUMENTS 1524768 9/1978 United Kingdom .

OTHER PUBLICATIONS

Bingham, "CMOS Makes Voltages Converter a Paragon of Efficiency", Electronics, 9/11/80, pp. 141-146.

Primary Examiner—John S. Heyman
Assistant Examiner—Timothy P. Callahan
Attorney, Agent, or Firm—E. M. Whitacre; J. S. Tripoli; E. P. Herrmann

[57] ABSTRACT

A two phase waveform generator for producing nonoverlapping pulses is designed with a CMOS inverter modified to include a resistor between the drain electrodes of the complementary inverter transistors and three conventional CMOS inverter circuits. The resistor n-type transistor interconnection exhibits a fast negative signal transition but a slower positive transition due to the resistor. This effect tends to shorten the duration of pulses applied to the inverter input. The shortened pulses are applied to a cascade connected pair of inverters to sharpen the waveform and produce a first phase output signal. The resistor-p-type transistor interconnection of the modified inverter exhibits a fast positive signal transition but a slower negative transition. This effect tends to widen pulses applied to the input. The widened pulses are applied to another inverter which complements the widened pulses ultimately generating narrower pulses which comprise a second phase signal. The first and second phase signals are antiphase with no pulse overlap.

7 Claims, 2 Drawing Figures

CIRCUITRY FOR GENERATING NON-OVERLAPPING PULSE TRAINS

BACKGROUND OF THE INVENTION

This invention relates to pulse forming circuitry, and in particular to circuitry for generating non-overlapping complementary waveforms.

Frequently in electronic switching operations where a plurality of switches are alternately opened and closed electronically, it is desirable to open particular switches before alternate switches are closed. A particular example is in voltage multiplier circuits i.e. DC-DC converters, (see U.S. Pat. No. 3,955,353 or U.S. Pat. No. 4,106,086). Many circuits of this type require two phase or complementary clock pulse signals where the leading and trailing edges of the pulses of one phase do not overlap the trailing and leading edges of the second phase.

In generating non-overlapping two phase signals it is known to (a) develop complementary pulse signals wherein the leading and trailing edges of the first phase signal are substantially coincident with the trailing and leading edges of the second phase, (b) to add an incremental delay to the leading (trailing) edge of both phase signals i.e. slow the pulse transition in one direction from one state to the other and (c) apply the altered signals to high gain inverters or to threshold detectors with the result of speeding up the slowed transition and changing the duty cycle of the respective waveforms. The duty cycle of the waveform is changed due to the relative point in time at which the inverter responds to the slowed waveform transition—(e.g. the trailing edges) and the normal waveform transition (e.g. the leading edges). The positive portion of each cycle is thus reduced with respect to the relatively negative portion of each cycle of signal for both of the complementary waveforms eliminating the period of first and second phase coincidence or overlap. See for example the article "C-MOS makes voltage converter a paragon of efficiency" by D. Bingham at page 141 of the Sept. 11, 1980 issue of Electronics magazine.

SUMMARY OF THE INVENTION

In the present invention a single phase signal is applied to a first CMOS inverter which is modified to include a resistor between the drain electrodes of the series connected n-type and p-type transistors. A first inverted output signal having slowed negative going amplitude transitions is available at the drain electrode of the p-type transistor. This signal is applied to the input of a second CMOS inverter. The second inverter produces at its output terminal a signal in phase with the input signal to the first inverter, but having a reduced duty cycle and with its positive going transitions delayed relative to the negative going transition. A second inverted output signal having delayed positive going amplitude transitions available at the drain electrode of the n-type transistor is applied to a third CMOS inverter. The output signal of the third inverter is in phase with the signal input to the first inverter but with a larger duty cycle. The negative going transitions of this output signal are delayed with respect to the positive going transitions. This latter signal is applied to the input of a fourth inverter which complements it producing a signal with a lesser duty cycle than the original signal and with its positive going signal transitions delayed relative to its negative going transitions. The output signals from the second and fourth inverters are substantially antiphase with no pulse overlap.

DETAILED DESCRIPTION OF THE INVENTION

In the description to follow the circuit is illustrated using complementary symmetry metal-oxide-semiconductor (CMOS) devices in accordance with known techniques but it should be appreciated that circuit elements may be substituted with elements performing equivalent functions. For example, in FIG. 1 the CMOS inverters I1, I3 and I4 may be substituted with bipolar or NMOS inverters.

Figure 1:
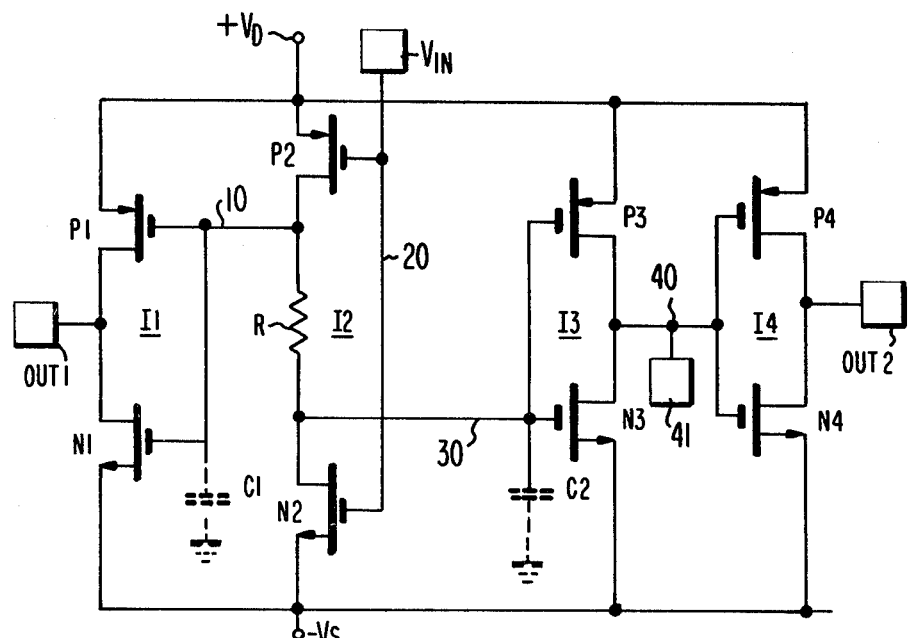
FIG. 1 is a schematic diagram of a circuit for producing two phase non-overlapping pulsed signal waveforms embodying the present invention.

Referring to FIG. 1, transistors designated P(i) are assumed to be p-type enhancement mode MOS devices. Transistors designated N(i) are n-type enhancement mode MOS devices. An oscillatory signal, having an amplitude nominally equal to the difference in supply potentials i.e. $(V_D - V_S)$ is applied at input terminal Vin. A first output signal is produced at terminal OUT1 and is in phase with the input signal. A second output signal is produced at terminal OUT2 and is substantially antiphase to the first output signal with the two output signals having no pulse overlap. A third signal is available at terminal 41, the third signal being in phase with the input signal. The pulses of the third signal typically overlap the pulses of the first output signal.

Transistors P2 and N2 having their respective source electrodes connected to relatively positive ($+V$) and relatively negative ($-V$) supply potential, having their drain electrodes serially connected via resistor R, and having their gate or control electrodes connected in common to input terminal Vin form an inverting amplifier I2. Inverter I2 is typically a high gain inverting amplifier the output of which saturates substantially at the supply potentials for input signals deviating slightly from $(V_D - V_S)/2$. (Note it is assumed that the input signal has a large enough amplitude to saturate the inverter I2 output in both the positive and negative direction.) Two output signals are available from inverter I2, one at connection 10 and a second at connection 30. The two output signals are in phase with each other but complementary, i.e. 180 degrees out of phase, to the input signal. Resistor R isolates the output connections 10 and 30 and permits limited tailoring of the two output signal waveforms with respect to each other. Connection 10 has a finite amount of stray capacitance C1 associated therewith. To produce a potential change at 10 this capacitance must be charged or discharged. Assuming transistors N2 and P2 are matched and, therefore, have substantially identical source-drain impedance when conducting, the inclusion of resistor R enhances the discharging impedance of connection 10 with respect to the charging impedance. As a result negative going output transitions at connection 10 are slower than positive going transitions. The negative transition times can be made substantially longer by placing additional capacitance in parallel with stray capacitance C1. For similar reasons the positive going output transitions are slower at connection 30 than the negative going transitions i.e. the charging impedance through transistor P2 of connection 30 is enhanced by the resistor R with respect to the discharging impedance through transistor N2.

Figure 2:
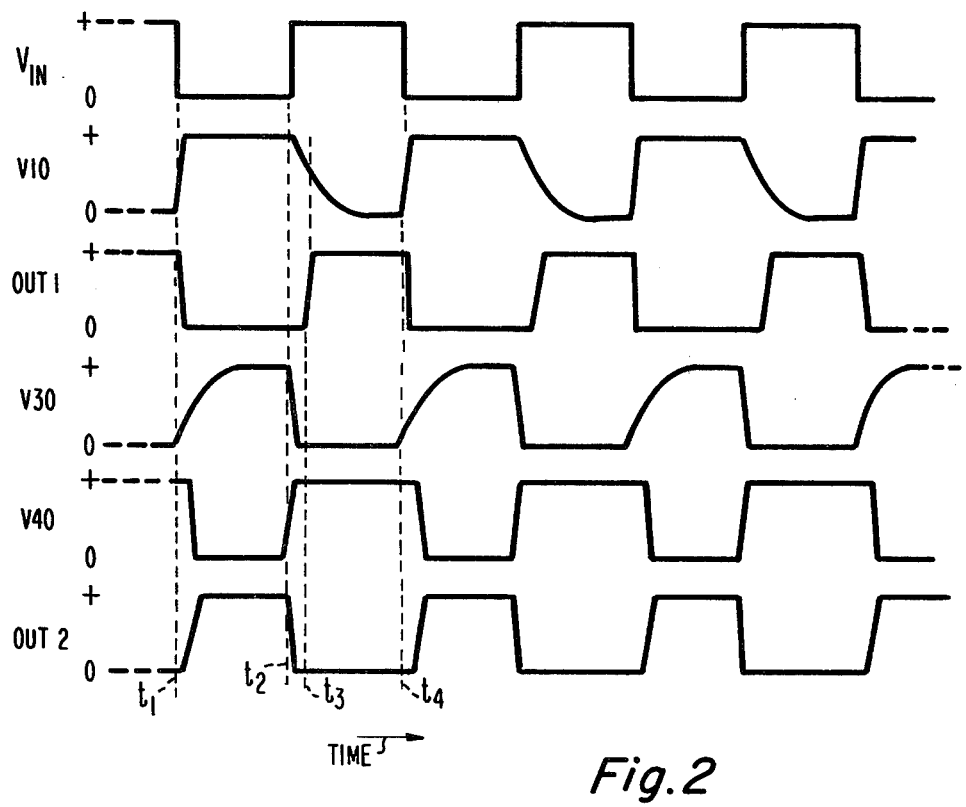
FIG. 2 is a voltage-time graph of the potential at particular points of the FIG. 1 circuit.

The effect of the resistance R on the signals at connections 10 and 30 is illustrated in FIG. 2. In the figure the uppermost waveform is the signal applied to the input terminal Vin. The amplitude levels (+) and (0) correspond respectively to the supply potentials $V_D$ and $V_S$. The waveform designated V10 is the potential occurring at connection 10. The V10 waveform is generally complementary to the input signal Vin. The trailing edge of each pulse exhibits an RC discharge characteristic (exaggerated) related to the resistance R and the capacitance C1. The waveform designated V30 is the potential occurring at connection 30. This waveform is also substantially complementary to the input signal Vin. The leading edge of each pulse in signal V30, however, exhibits an RC charging characteristic related to the series resistor R and the capacitance C2.

Referring again to FIG. 1, transistors P1 and N1 having their respective source electrodes connected to $V_D$ and $V_S$ supply potentials, their drain electrodes serially connected, and their gates or control electrodes connected in common at connection 10 form inverter circuit I1. If transistors P1 and N1 are a matched complementary pair the I1 inverter output at the common drain connection of the transistors (OUT1) will switch from a high (low) to a low (high) state when its input potential at connection 10 makes an excursion through one half the supply potential i.e. $(V_D-V_S)/2$ volts. The positive and negative transition times will be substantially similar. Fast input signal transitions result in fast output signal transistions which are substantially coincident therewith. A slow input transition also produces a relatively fast output transition at the point in time when the input potential crosses $(V_D-V_S)/2$.

Consider the FIG. 2 waveform V10 as the inverter I1 input signal and waveform OUT1 as inverter I1 output signal. Positive going transitions of signal V10 produce negative going output transitions. Since the positive input transitions of waveform V10 are relatively fast (at t1 for example) and there is little inherent delay in the inverter I1, the negative output transition at terminal OUT1 occurs substantially coincidentally with the input transition. The negative going input transition (signal V10 at time t2) however, is slow and the inverter does not switch until the input potential drops to one half the supply potential at time t3. The effect is to reduce the pulse width by the time (t3−t2) and delay the positive output transition at OUT1 by the same amount relative to the positive signal transitions of the input signal Vin. The negative transitions of the output signal OUT1 are substantially unchanged relative to the negative transitions of input signal Vin.

Transistors P3 and N3 form a third inverter I3 which is characterized similarly to inverter I1. The input to inverter I3 is connected to receive the output signal from inverter I2 at connection 30 and has an output terminal 41 connected to the drain electrode interconnection 40 of transistor N3 and P3. Signal V30 (FIG. 2) is the input signal to inverter I3 and signal V40 is its resulting output signal at terminal 41. In this instance since the negative going input transitions to inventer I3 are relatively fast, they produce substantially coincident positive going output transitions. On the other hand, the positive going transitions of signal V30 are relatively slow, delaying the negative going output transition at terminal 41 until V30 traverses the potential $(V_D-V_S)/2$. Delaying the negative going output transitions of waveform V40 tends to extend the pulse width of the output signal V40 by the delay period. Resulting waveform V40 has positive going transitions which are substantially coincident with the positive going transistion of input signal Vin and negative going transitions which are delayed with respect to the negative going transitions of signal Vin.

A fourth similar inverter I4, comprising serially connected transistors N4 and P4, having an input connection at terminal 40 and an output connection OUT2, complements, i.e. shifts in phase by 180 degrees, the inverter I3 output signal V40. The inverter I4 output signal transitions are generally coincident with transitions of its input signal. Since the input signal to inverter I4 was in phase with the input signal Vin, the inverter I4 output signal is generally antiphase to signal Vin. Additionally, the input pulse width (V40) to inverter I4 being wider than the pulse width of signal Vin, the complementary output pulse width at OUT2, is necessarily narrower than the pulse width of Vin. Finally, the negative going transitions of both OUT1 and OUT2 waveforms remain in constant time relation to successive transitions of input signal Vin and the positive going transitions of both the OUT1 and OUT2 waveforms have been delayed in time relative to successive transitions of the Vin waveform so that the pulses of waveforms OUT1 and OUT2 necessarily cannot overlap.

Inverters I1 and I3 may be tailored to produce greater delays with smaller capacitance and resistance values. This is accomplished by altering their switching characteristics i.e. including an intentional mismatch in the n-type and p-type transistors in the individual inverters. For example inverter I1 may be designed to switch states at the input potential of $(V_D-V_S)/10$ and inverter I3 may be designed to switch at $(V_D-V_S)/1.1$. Inverter I1 will switch at a much lower point on its negative going input transition and inverter I3 will switch at a much higher point on its positive going input transition. In both cases the delay in switching is extended for a given resistance and capacitance. The switching points for fast input transitions will be substantially unaffected.

What is claimed is:

1. Circuitry for generating non-overlapping pulse trains, consisting of:
   means for applying supply potential;
   first and second transistors of complementary conductivity types, each transistor having respective first, second and control electrodes, and having principle conduction paths between their first and second electrodes controlled by potential applied between their control and first electrodes;
   resistive means connected between the second electrodes of the first and second transistors;
   an input terminal connected to the control electrodes of said first and second transistors;
   respective means connecting the respective first electrodes of the first and second transistors to the means for applying supply potential to condition the respective transistors to conduct and operate as amplifiers;
   an inverting amplifier having a sole input terminal connected at the second electrode of the first transistor and having an output terminal at which a first output signal is available; and a noninverting amplifier having a sole input terminal connected at the second electrode of the second transistor, having an output terminal at which a second output signal is available, and wherein a large signal oscillatory signal applied to the input terminal produces first and second output signals that are antiphase with no pulse overlap.

2. Circuitry for generating non-overlapping pulse trains, consisting of:

means for applying supply potential;

first and second transistors of complementary conductivity types, each transistor having respective first, second and control electrodes, and having principle conduction paths between their first and second electrodes controlled by potential applied between their control and first electrodes;

resistive means connected between the second electrodes of the first and second transistors;

an input terminal connected to the control electrodes of said first and second transistors;

respective means connecting the respective first electrodes of the first and second transistors to the means for applying supply potential to condition the respective transistors to conduct and operate as amplifiers;

an inverting amplifier having a sole input terminal connected at the second electrode of the second transistor, having an output terminal at which a second output signal is available;

first capacitive means coupled between the second electrode of the first transistor and a point of fixed potential; and second capacitive means coupled between the second electrode of the second transistor and a point of fixed potential; and wherein a large signal oscillatory signal applied to the input terminal produces first and second output signals that are antiphase with no pulse overlap.

3. The circuitry set forth in claim 2 wherein the inverting amplifier comprises a first inverter circuit including:

third and fourth transistors respectively similar to the first and second transistors, said third and fourth transistors having their respective second electrodes connected to an inverter output terminal, their respective control electrodes connected to an inverter input terminal and their respective first electrodes connected to the means for applying supply potential to condition said third and fourth transistors to conduct.

4. The circuitry set forth in claim 3 wherein the noninverting amplifier comprises second and third inverter circuits similar to the first inverter circuit, said second and third circuits being connected in cascade and wherein complementary signal, are available at the respective output terminal, of said second and third inverter circuits.

5. The circuitry set forth in claim 4 wherein the first, second and third inverters respectively exhibit first and second output states, each inverter changing output state for signal amplitude transitions applied to their respective input terminals going through one half the supply potential.

6. The circuitry set forth in claim 4 or 5 wherein the first, second and third inverter circuits are CMOS inverters.

7. A two phase non-overlapping pulse waveform generator comprising:

means for applying supply potential;

a first CMOS inverter having an input terminal for applying input signal, and including an n-type and a p-type MOS transistor having their respective conduction paths serially connected by a resistor;

second, third and fourth CMOS inverters having respective input and output terminals, each inverter including an n-type and a p-type transistor with their respective conduction paths serially connected by a direct connection to the respective inverter output terminal;

means connecting the input terminal of the second inverter at the first inverter resistor and p-type transistor interconnection;

means connecting the input terminal of the third inverter at the first inverter resistor and n-type transistor interconnection;

means connecting the output terminal of the third inverter to the input terminal of the fourth inverter; and means connecting the means for applying supply potential to the first, second third and fourth CMOS inverters for normal operation;

a first capacitor connected between the input terminal of the second CMOS inverter and a point of fixed potential; and a second capacitor connected between the input terminal of the third CMOS inverter and a point of fixed potential, wherein first and second complementary non-overlapping output pulse trains are generated at the output of said second and fourth inverters.

* * * * *